(12) United States Patent
Kobayashi

(10) Patent No.: US 6,313,508 B1
(45) Date of Patent: *Nov. 6, 2001

(54) SEMICONDUCTOR DEVICE OF HIGH-VOLTAGE CMOS STRUCTURE AND METHOD OF FABRICATING SAME

(75) Inventor: Kenya Kobayashi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/179,851

(22) Filed: Oct. 28, 1998

(30) Foreign Application Priority Data

Oct. 28, 1997 (JP) .................................... 9-295748

(51) Int. Cl.[7] ................................................... H01L 27/01
(52) U.S. Cl. ......................... 257/351; 257/338; 257/339; 257/335; 257/350
(58) Field of Search .................................. 257/338, 339, 257/341, 347, 350, 351, 335

(56) References Cited

U.S. PATENT DOCUMENTS 4,626,293 * 12/1986 Schols ................................. 438/268
5,777,365 * 7/1998 Yamaguchi et al. ................. 257/347
5,874,768 * 2/1999 Yamaguchi et al. ................. 257/493
5,923,071 * 7/1999 Saito ................................... 257/458
5,939,755 * 8/1999 Takeuchi et al. .................... 257/347
6,025,237 * 2/2000 Choi ................................... 438/301
6,037,634 * 3/2000 Akiyama ............................ 257/347
6,130,458 * 10/2000 Takagi et al. ....................... 257/351
6,242,787 * 6/2001 Nakayama et al. ................. 257/493

FOREIGN PATENT DOCUMENTS 8-148684    6/1996   (JP) .

OTHER PUBLICATIONS

K.K.Ng, Complete Guide to Semiconductor Devices, McGraw–Hill Inc., pp. 174–175, 1995.*

* cited by examiner

Primary Examiner—Eddie Lee
Assistant Examiner—George C. Eckert, II
(74) Attorney, Agent, or Firm—Foley & Lardner

(57) ABSTRACT

A transistor of a second conductivity type is of an LMOS structure, and a transistor of a first conductivity type is of an LDMOS structure. The transistor of the first conductivity type has a drain base layer which functions in the same manner as a drain offset diffusion layer and is formed in a substrate separately from a source base diffusion layer. The transistor of the first conductivity type has a stably high breakdown voltage and a low on-state resistance as with the transistor of the second conductivity type.

7 Claims, 11 Drawing Sheets

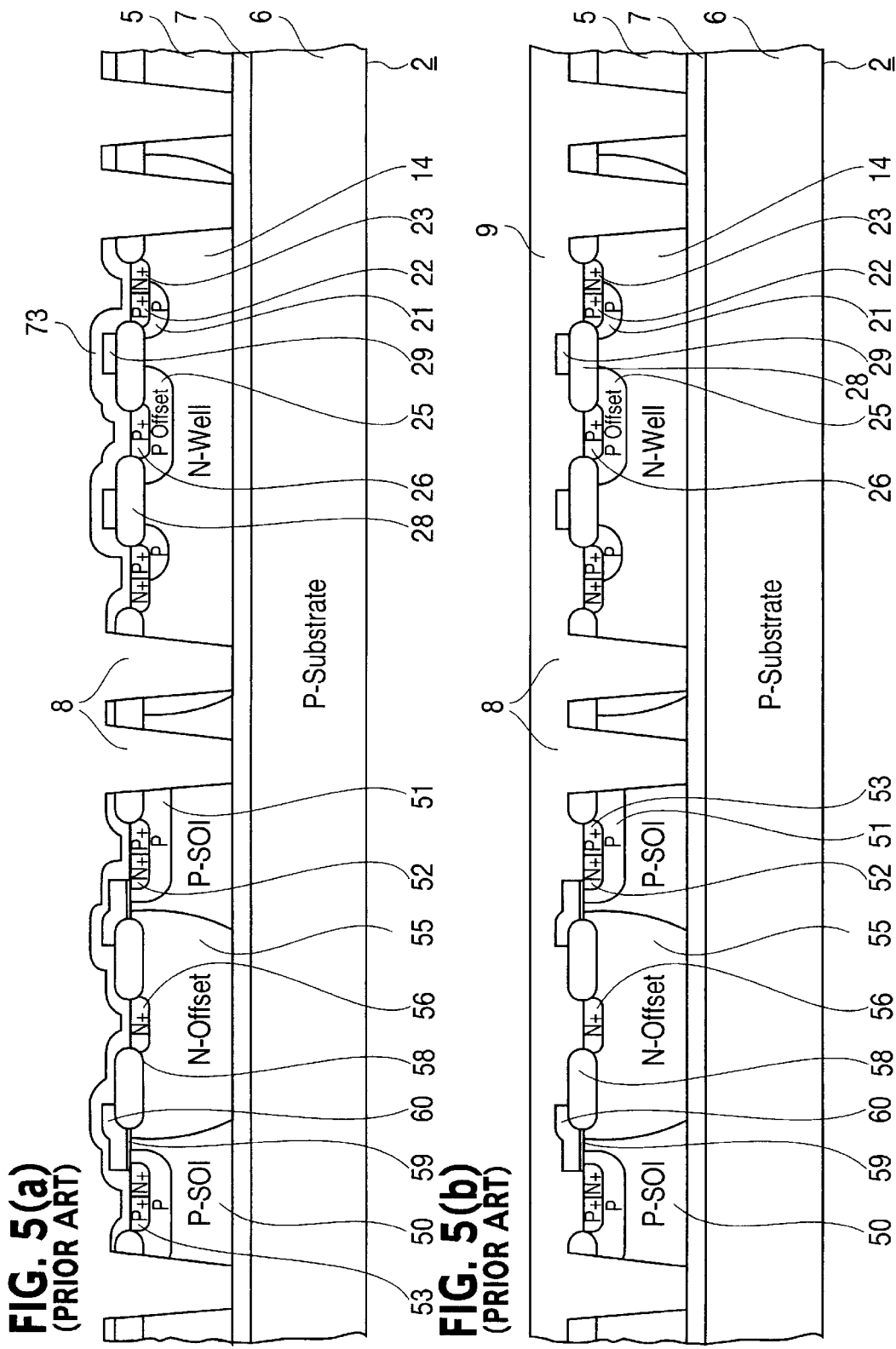

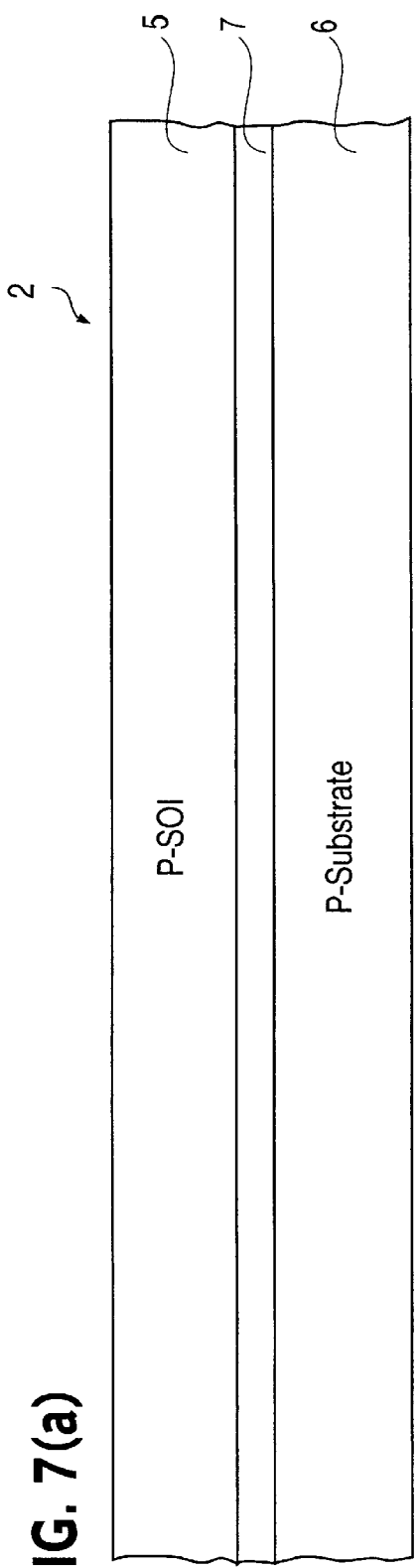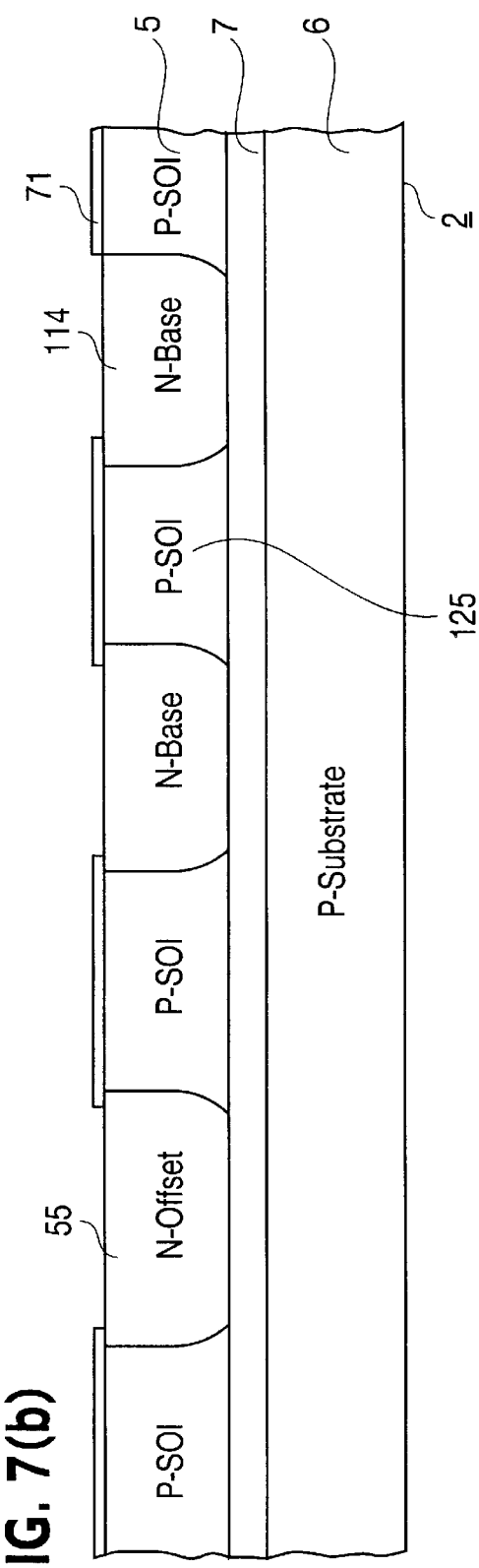
FIG. 7(a)
FIG. 7(b)

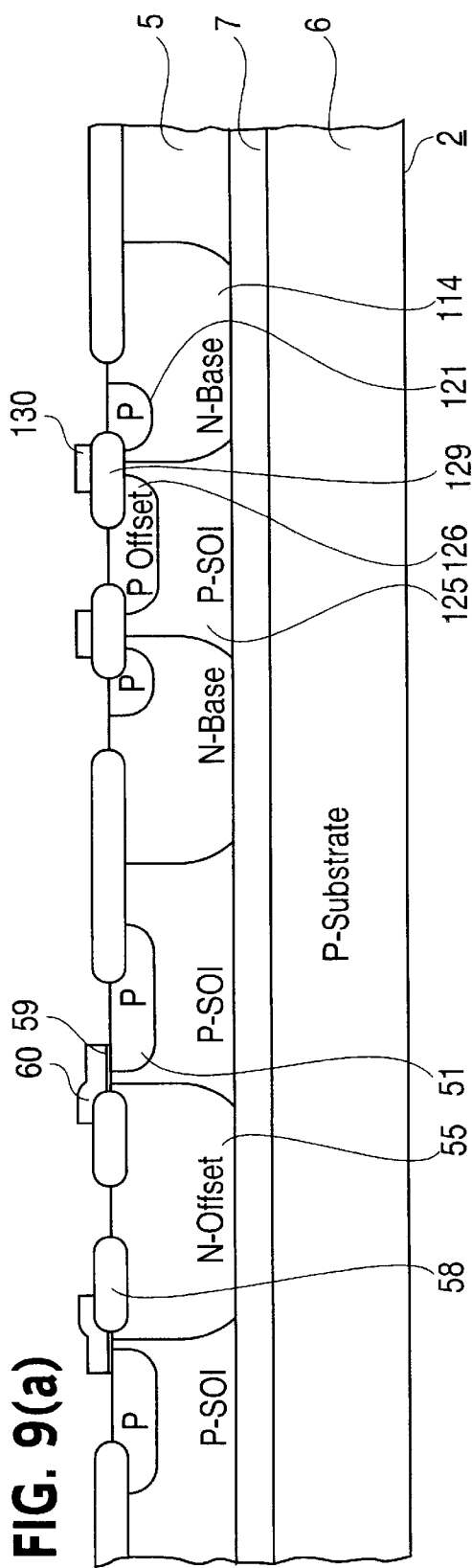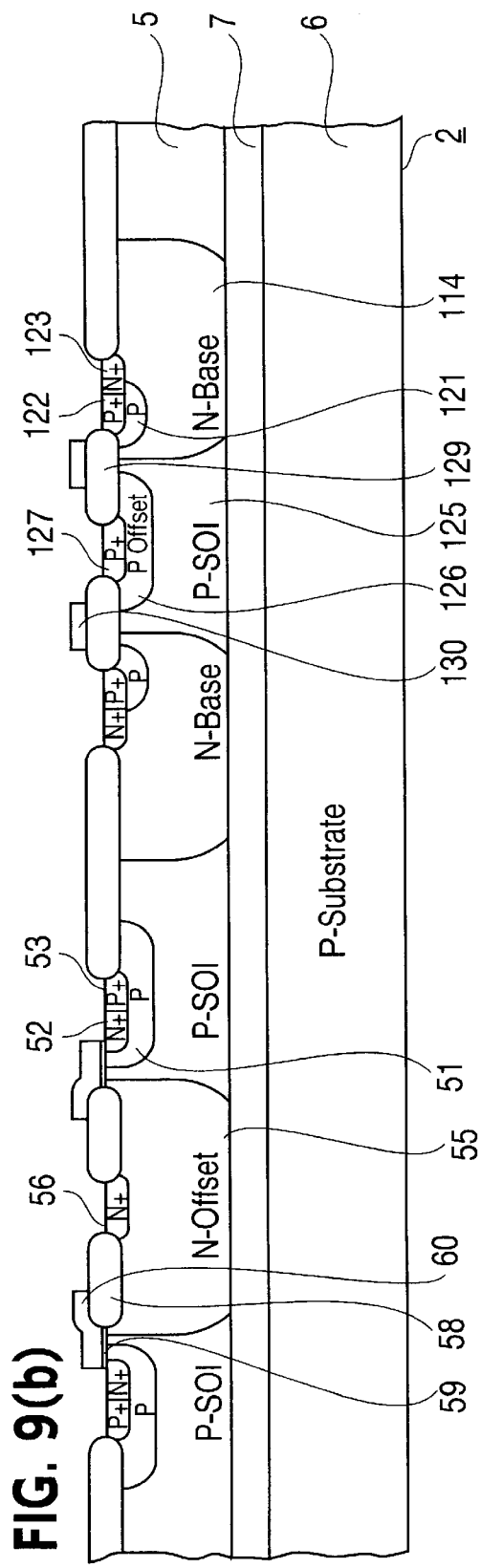
FIG. 9(a)
FIG. 9(b)

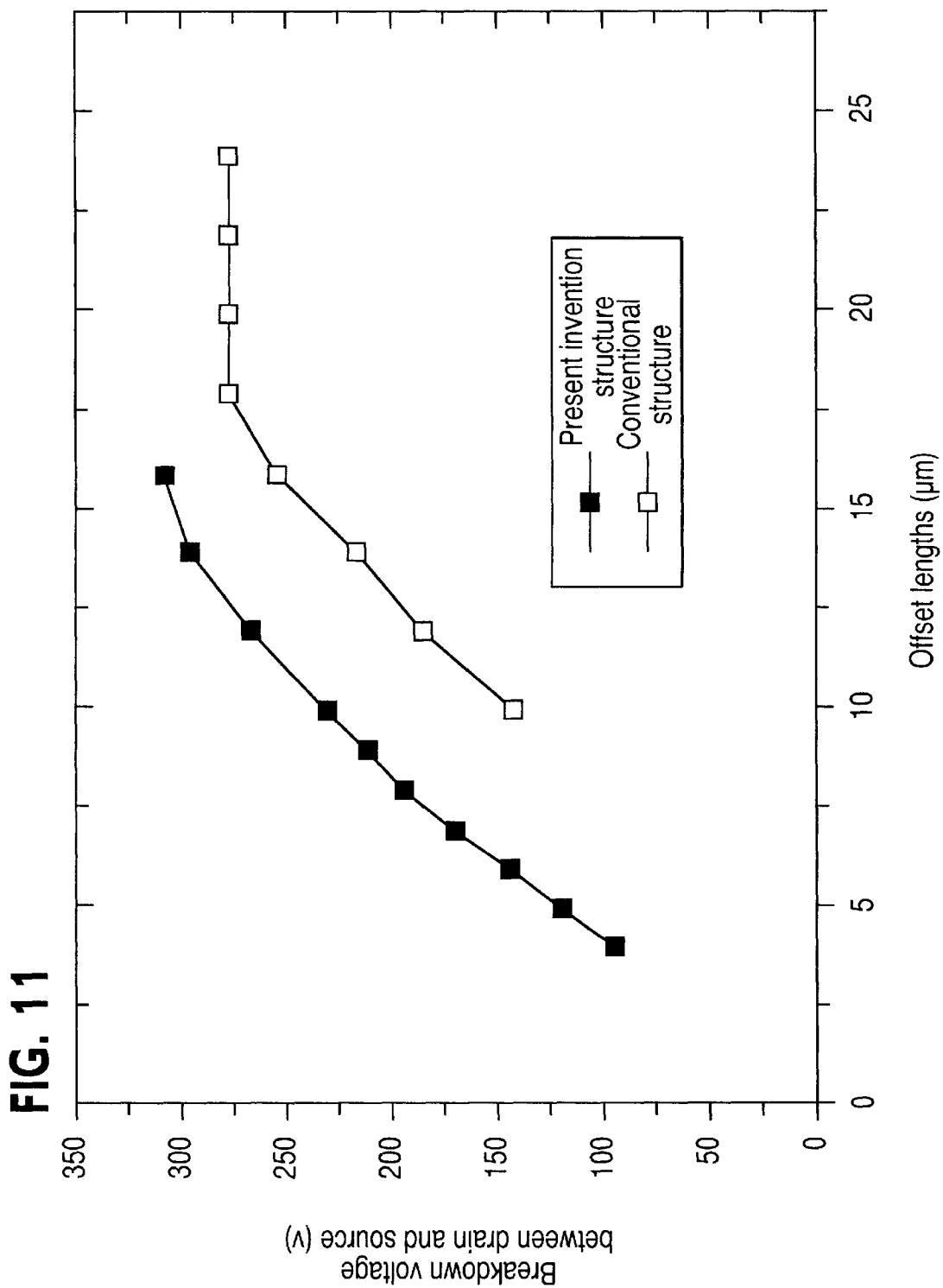

SEMICONDUCTOR DEVICE OF HIGH-VOLTAGE CMOS STRUCTURE AND METHOD OF FABRICATING SAME

BACKGROUND OF THE INVENTION

1. Field of the Invention

The present invention relates to a semiconductor device of high-voltage CMOS structure, and a method of fabricating such a semiconductor device of high-voltage CMOS structure.

2. Description of the Related Art

Heretofore, semiconductor devices of CMOS (Complementary Metal Oxide Semiconductor) structure comprising a pair of P- and N-type MOS transistors formed on a single SOI (Silicon-On-Insulator) substrate have been used in various applications. Such semiconductor devices of CMOS structure are available in a variety of types. CMOS circuits for use as plasma display panel drive circuits need to withstand high voltages. It has been proposed to employ an offset structure for P- and N-type MOS transistors in such CMOS circuits.

One conventional semiconductor device of CMOS structure will be described below with reference to FIGS. 1 through 5(b) of the accompanying drawings. FIG. 1 is a fragmentary vertical cross-sectional view showing a multi-layer structure of a CMOS circuit as the conventional semiconductor device, and FIGS. 2(a) through 5(b) are fragmentary vertical cross-sectional views illustrative of successive steps of a process of fabricating the CMOS circuit shown in FIG. 1.

The conventional semiconductor device will be described on the assumption that layers are successively formed on a substrate in an upward direction. Such a direction is employed by way of example only for the sake of brevity, and will not limit any direction in which the semiconductor device is actually fabricated and used. Layers or films with a higher concentration are indicated by $P^+$ and $N^+$, and those with a lower concentration are indicated by $P^-$ and $N^-$. In FIGS. 1 through 5(b) and other figures, "P+", "N+", "P−", "N−" should be construed to mean "$P^+$", "$N^+$", "$P^-$", "$N^-$", respectively.

As shown in FIG. 1, a CMOS circuit 1 has a single SOI substrate 2 of a P-type which is a first conductivity type. On the SOI substrate 2, there are disposed a P-channel first transistor 3 of the first conductivity type and an N-channel second transistor 4 of a second conductivity type. Each of the first and second transistors 3, 4 is of an offset LMOS (Lateral MOS) structure.

The SOI substrate 2 comprises first and second substrates 5, 6 each of the $P^-$-type which is the first conductivity type. The first and second substrates 5, 6 are integrally joined to each other by an embedded oxide film 7. The first and second transistors 3, 4 are disposed in only the first substrate 5 that is positioned above the embedded oxide film 7. The first and second transistors 3, 4 are isolated from each other by a trench 8 and a laminated oxide film 9.

The P-channel first transistor 3 comprises a source 11, a gate 12 positioned inside of the source 11, and a drain 13 positioned centrally therein. The source 11, the gate 12, and the drain 13 are positioned on a single $N^-$-type well 14 disposed in the first substrate 5.

The source 11 of the first transistor 3 comprises a P-type source diffusion layer 21 positioned on the $N^-$-type well 14, a $P^+$-type source contact diffusion layer 22 positioned on an upper surface of the P-type source diffusion layer 21, and an $N^+$-type back-gate contact diffusion layer 23 positioned on the $N^-$-type well 14 outside of the $P^+$-type source contact diffusion layer 22. A source electrode 24 is positioned on the contact diffusion layers 22, 23.

The drain 13 of the first transistor 3 comprises a P-type drain offset diffusion layer 25 positioned on the $N^-$-type well 14 and a $P^+$-type drain contact diffusion layer 26 positioned centrally on an upper surface of the P-type drain offset diffusion layer 25. A drain electrode 27 is positioned on the $P^+$-type drain contact diffusion layer 26.

The drain offset diffusion layer 25 and the source diffusion layer 21 project from the respective contact diffusion layers 26, 22 toward the gate 12, and a field oxide film 28 is positioned on upper surfaces of the offset regions of the drain offset diffusion layer 25 and the source diffusion layer 21. A gate electrode 29 is positioned on an upper surface of the field oxide film 28 which doubles as a gate oxide film, and a gate extension electrode 30 is positioned on an upper surface of the gate electrode 29.

The N-channel second transistor 4 is disposed in juxtaposed relation to the P-channel first transistor 3. The N-channel second transistor 4 has a source 41, a gate 42 positioned inside of the source 41, and a drain 43 positioned centrally therein.

In the source 41 of the second transistor 4, the $P^-$-type first substrate 5 serves as a source base layer 50, and a P-type source shield diffusion layer 51 is positioned on the source base layer 50. An $N^+$-type source contact diffusion layer 52 and an $P^+$-type back-gate contact diffusion layer 53 are positioned respectively on inner and outer regions of an upper surface of the source shield diffusion layer 51. A source electrode 54 is positioned on the contact diffusion layers 52, 53.

In the drain 43 of the second transistor 4, an N-type drain offset diffusion layer 55 is disposed in the $P^-$-type first substrate 5. An $N^+$-type drain contact diffusion layer 56 is positioned centrally on an upper surface of the offset diffusion layer 55. A drain electrode 57 is positioned on the drain contact diffusion layer 56.

The drain offset diffusion layer 55 and the source shield diffusion layer 51 project from the respective contact diffusion layers 56, 52 toward the gate 42, and a field oxide film 58 and a gate oxide film 59 are positioned on upper surfaces of the offset regions of the drain offset diffusion layer 55 and the source shield diffusion layer 51. A gate electrode 60 is positioned on an upper surface of the oxide films 58, 59, and a gate extension electrode 61 is positioned on an upper surface of the gate electrode 60.

The electrodes 24, 27, 30, 54, 57, 61 of the first and second transistors 3, 4 extend through the laminated oxide film 9 on which an isolation layer (not shown) is positioned. The isolation layer is partly removed to expose the electrodes 24, 27, 30, 54, 57, 61, which provide connection pads (not shown).

In the CMOS circuit 1 of the above structure, since both the P-channel first transistor 3 and the N-channel second transistor 4 are of an LMOS structure, currents flow laterally from the source electrodes 24, 54 through the gates 12, 42 to the drain electrodes 27, 57.

Furthermore, both the transistors 3, 4 are of an offset structure in which the drain offset diffusion layers 25, 55 extend to lower surfaces of the field oxide film 28 and the field and gate oxide films 58, 59. Therefore, the breakdown voltage of these transistors 3, 4 is so high that the transistors 3, 4 are capable of switching high voltages.

A process of fabricating the CMOS circuit 1 will briefly be described below with reference to FIGS. 2(a) through 5(b).

As shown in FIG. 2(a), first and second substrates 5, 6 of P⁻-type silicon are prepared, and integrally joined to each other by an embedded oxide film 7 in the form of an SiO₂ film having a thickness of about 2 µm. The first substrate 5 is ground to a thickness of about 5 µm, thus producing a single SOI substrate 2.

Then, as shown in FIG. 2(b), a thermal oxide film (not shown) is formed on the entire upper surface of the first substrate 5, and patterned into a mask 71 of predetermined shape. An impurity of phosphorus is introduced into the first substrate 5 through openings of the mask 71 by ion implantation. The assembly is heated to diffuse the introduced phosphorus down to the upper surface of the embedded oxide film 7, for thereby simultaneously forming an N⁻-type well 14 of a first transistor 3 and a drain offset diffusion layer 55 of a second transistor 4.

Then, as shown in FIG. 3(a), after the mask 71 is removed, a mask 72 of another shape is formed. An impurity of boron is then introduced into the first substrate 5 through openings of the mask 72 by ion implantation. The assembly is heated to diffuse the introduced boron to a depth ranging from 1 to 2 µm from the surface of the first substrate 5, for thereby simultaneously forming a P-type source diffusion layer 21 and a drain offset diffusion layer 25 of the first transistor 3 and a source shield diffusion layer 51 of the second transistor 5.

Thereafter, the mask 72 is removed, and then a mask of predetermined shape (not shown) is formed of nitride. As shown in FIG. 3(b), field oxide films 28, 58 are formed to a thickness ranging from 0.5 to 1.0 µm by LOCOS (Local Oxidation of the Surface or Local Oxidization of Silicon).

A thermal oxide film and a polysilicon film are formed on the entire surface formed thus far according to CVD (Chemical Vapor Deposition), and an impurity of phosphorus is diffused to make the polysilicon film electrically conductive. As shown in FIG. 4(a), the electrically conductive polysilicon film and the thermal oxide film are then patterned at the same time, thus forming a gate oxide film 59 of the second transistor 3 with the thermal oxide film and gate electrodes 29, 60 of the first and second transistors 3, 4 with the electrically conductive polysilicon film.

Masks of predetermined shape (not shown) are then formed, and phosphorus and boron are introduced into various regions thereby to form contact diffusion layers 22, 23, 26, 52, 53, 56 of the first and second transistors 3, 4 as shown in FIG. 4(b).

Then, as shown in FIG. 5(a), an oxide film having a thickness of 100 nm is formed by CVD and patterned into a mask 73. Thereafter, trenches 8 are formed around the first and second transistors 3, 4 by silicon etching through the mask 73. As shown in FIG. 5(b), a laminated oxide film 9 is deposited to a thickness ranging from 1 to 2 µm in order to fill up the trenches 8, thus isolating the first and second transistors 3, 4 from each other.

Thereafter, as shown in FIG. 1, contact holes are defined in the laminated oxide film 9, and electrodes 24, 27, 30, 54, 57, 61 of the first and second transistors 3, 4 are formed to a thickness ranging from 0.5 to 2.0 µm by sputtering aluminum or the like. In this manner, a CMOS circuit 1 is completed.

In the CMOS circuit 1, both the P-channel first transistor 3 and the N-channel second transistor 4 are of an offset LMOS structure for increasing the breakdown voltage thereof. Actually, however, the breakdown voltage of the P-channel first transistor 3 is lower than that of the N-channel second transistor 4, and has a high on-state resistance.

The breakdown voltage of the first transistor 3 is governed by the joined state between the drain offset diffusion layer 25 and the N⁻-type well 14, and the breakdown voltage of the second transistor 4 is governed by the joined state between the drain offset diffusion layer 55 and the source base layer 50. The breakdown voltage of the second transistor 4 is stable because the impurity is diffused only into the drain offset diffusion layer 55 which is joined to the source base layer 50.

In the first transistor 3, the N⁻-type well 14 formed by diffusing phosphorus into the P⁻-type first substrate 5 and the P-type drain offset diffusion layer 25 formed by diffusion of boron into the N⁻-type well 14 are joined to each other. Therefore, the impurities are diffused to form both the layers 14, 25, and the impurities are diffused twice to form the layer 25. As a result, it is difficult to stabilize the breakdown voltage of the first transistor 3.

The breakdown voltage of the first and second transistors 3, 4 also depends on the radii of curvature of the above joined boundaries. The drain offset diffusion layer 25 of the first transistor 3 is shallower than the drain offset diffusion layer 55 of the second transistor 4. Therefore, the radius of curvature of the joined boundary of the drain offset diffusion layer 25 is smaller than the radius of curvature of the joined boundary of the drain offset diffusion layer 55. Accordingly, the breakdown voltage of the first transistor 3 is relatively low in view of the smaller radius of curvature of the joined boundary of the drain offset diffusion layer 25.

Inasmuch as the breakdown voltage of the first transistor 3 is low, the drain offset diffusion layer 25 cannot be reduced in size. Thus, the area occupied by the first transistor 3 cannot be reduced in size. For this reason, it is difficult to reduce the overall chip area of the CMOS circuit 1. The amount of the material of the SOI substrate 2 which is complex in structure and expensive cannot be cut down, and it is difficult to increase the productivity of the CMOS circuit 1.

In addition, while the second transistor 4 has a low on-state resistance because a drain current flows through the drain offset diffusion layer 55 that is wide and deep, the on-state resistance of the first transistor 3 is high as the drain offset diffusion layer 25 for a drain current to flow therethrough is narrow and shallow.

SUMMARY OF THE INVENTION

It is therefore an object of the present invention to provide a semiconductor device which has a stably high breakdown voltage and a low on-state resistance, and a method of fabricating such a semiconductor device.

According to an aspect of the present invention, there is provided a semiconductor device of CMOS structure comprising an SOI substrate composed of first and second substrates of a first conductivity type which are integrally joined to each other by an embedded oxide film interposed therebetween, and a pair of offset transistors of MOS structure which are of first and second conductivity types, respectively, the transistors being disposed in the SOI substrate and isolated from each other, the transistor of the second conductivity type being of an LMOS structure, the transistor of the first conductivity type being of an LDMOS (Lateral Double-diffused MOS) structure.

In the transistor having the LDMOS structure, a dedicated source base diffusion layer separate from a source diffusion layer is formed in the first substrate, and a drain base layer joined to the source base diffusion layer is formed in the first substrate. Since the drain base layer functions in the same manner as a drain offset diffusion layer, the transistor of the first conductivity type which is of the LDMOS structure has a stably high breakdown voltage and a low on-state resistance as with the transistor of the second conductivity type. The first conductivity type is either one of P type and N type, and the second conductivity type is the other type.

According to another aspect of the present invention, there is provided a semiconductor device of CMOS structure comprising an SOI substrate composed of first and second substrates of a first conductivity type which are integrally joined to each other by an embedded oxide film interposed therebetween, and a pair of offset transistors of MOS structure which are of first and second conductivity types, respectively, the transistors being disposed in the SOI substrate and isolated from each other, the transistor of the second conductivity type being of an LMOS structure comprising a source base layer of the first conductivity type composed of the first substrate, a source contact diffusion layer of the second conductivity type positioned on the source base layer, a gate oxide film positioned on ends of the source contact diffusion layer and the source base layer, and a drain offset diffusion layer of the second conductivity type disposed in the first substrate and extending underneath the gate oxide film, the transistor of the first conductivity type comprising a source base diffusion layer of the second conductivity type disposed in the first substrate, a source diffusion layer of the first conductivity type positioned on the source base diffusion layer, a source electrode electrically connected to the source diffusion layer, a field oxide film positioned on ends of the source diffusion layer and the source base diffusion layer and doubling as a gate oxide film, a gate electrode positioned on the field oxide film, a drain base layer of the first conductivity type composed of the first substrate, a drain offset diffusion layer of the first conductivity type positioned on the drain base layer and extending underneath the field oxide film, and a drain electrode electrically connected to the drain offset diffusion layer.

In the transistor of the first conductivity type, therefore, the dedicated source base diffusion layer separate from the source diffusion layer is positioned in the first substrate, and the drain base layer joined to the source base diffusion layer is positioned in the first substrate. Since the drain base layer functions in the same manner as the drain offset diffusion layer, the transistor of the first conductivity type has a stably high breakdown voltage and a low on-state resistance as with the transistor of the second conductivity type.

According to still another aspect of the present invention, there is provided a semiconductor device of CMOS structure comprising an SOI substrate composed of first and second substrates of a first conductivity type which are integrally joined to each other by an embedded oxide film interposed therebetween, and a pair of offset transistors of MOS structure which are of first and second conductivity types, respectively, the transistors being disposed in the SOI substrate and isolated from each other, the transistor of the second conductivity type comprising a source base layer of the first conductivity type composed of the first substrate, a source contact diffusion layer of the second conductivity type positioned on the source base layer, a source electrode electrically connected to the source contact diffusion layer, a gate oxide film positioned on ends of the source contact diffusion layer and the source base layer, a gate electrode positioned on the gate oxide film, a drain offset diffusion layer of the second conductivity type disposed in the first substrate and extending underneath the gate oxide film, and a drain electrode electrically connected to the drain offset diffusion layer, the transistor of the first conductivity type comprising a source base diffusion layer of the second conductivity type disposed in the first substrate, a source diffusion layer of the first conductivity type positioned on the source base diffusion layer, a source electrode electrically connected to the source diffusion layer, a field oxide film positioned on ends of the source diffusion layer and the source base diffusion layer and doubling as a gate oxide film, a gate electrode positioned on the field oxide film, a drain base layer of the first conductivity type composed of the first substrate, a drain offset diffusion layer of the first conductivity type positioned on the drain base layer and extending underneath the field oxide film, and a drain electrode electrically connected to the drain offset diffusion layer.

In the transistor of the first conductivity type, therefore, the dedicated source base diffusion layer separate from the source diffusion layer is positioned in the first substrate, and the drain base layer joined to the source base diffusion layer is positioned in the first substrate. Since the drain base layer functions in the same manner as the drain offset diffusion layer, the transistor of the first conductivity type has a stably high breakdown voltage and a low on-state resistance as with the transistor of the second conductivity type.

According to still yet another aspect of the present invention, there is provided a semiconductor device of CMOS structure comprising an SOI substrate composed of first and second substrates of a first conductivity type which are integrally joined to each other by an embedded oxide film interposed therebetween, and a pair of offset transistors of MOS structure which are of first and second conductivity types, respectively, the transistors being disposed in the SOI substrate and isolated from each other, the transistor of the second conductivity type comprising a source base layer of the first conductivity type composed of the first substrate, a source shield diffusion layer of the first conductivity type positioned on the source base layer, a source contact diffusion layer of the second conductivity type positioned on the source shield diffusion layer, a back-gate contact diffusion layer of the first conductivity type positioned on the source shield diffusion layer adjacent to the source contact diffusion layer, a source electrode positioned on the back-gate contact diffusion layer and the source contact diffusion layer, a gate oxide film positioned on ends of the source contact diffusion layer and the source base layer, a gate electrode positioned on the gate oxide film, a gate extension electrode positioned on the gate electrode, a drain offset diffusion layer of the second conductivity type disposed in the first substrate and extending underneath the gate oxide film, a drain contact diffusion layer of the second conductivity type positioned on the drain offset diffusion layer, and a drain electrode positioned on the drain contact diffusion layer, the transistor of the first conductivity type comprising a source base diffusion layer of the second conductivity type disposed in the first substrate, a source diffusion layer of the first conductivity type positioned on the source base diffusion layer, a source contact diffusion layer of the first conductivity type positioned on the source diffusion layer, a back-gate contact diffusion layer of the second conductivity type positioned on the source base diffusion layer adjacent to the source contact diffusion layer, a source electrode positioned on the source contact diffusion layer and the back-gate contact diffusion layer, a field oxide film positioned on ends of the source diffusion layer and the source base diffusion layer and doubling as a gate oxide film, a gate electrode positioned on the field oxide film, a gate extension electrode positioned on the gate electrode, a drain base layer of the first conductivity type composed of the first substrate, a drain offset diffusion layer of the first conductivity type positioned on the drain base layer and extending underneath the field oxide film, a drain contact diffusion layer of the first conductivity type positioned on the drain offset diffusion layer, and a drain electrode positioned on the drain contact diffusion layer.

In the transistor of the first conductivity type, therefore, the dedicated source base diffusion layer separate from the source diffusion layer is positioned in the first substrate, and the drain base layer joined to the source base diffusion layer is positioned in the first substrate. Since the drain base layer functions in the same manner as the drain offset diffusion layer, the transistor of the first conductivity type has a stably high breakdown voltage and a low on-state resistance as with the transistor of the second conductivity type.

In the semiconductor devices according to the above various aspects of the present invention, the source base diffusion layer of the transistor of the first conductivity type and the drain offset diffusion layer of the transistor of the second conductivity type extend from a surface of the first substrate to a surface of the embedded oxide film.

Consequently, in a process of fabricating the above semiconductor devices, when the source base diffusion layer of the transistor of the first conductivity type and the drain offset diffusion layer of the transistor of the second conductivity type are forming by diffusing impurities into the first substrate, the diffusion of the impurities are stopped at the position of the embedded oxide film. Therefore, these diffusion layers are formed stably to constant shape.

There is also provided in accordance with the present invention a method of fabricating a semiconductor device of CMOS structure having an SOI substrate composed of first and second substrates of a first conductivity type which are integrally joined to each other by an embedded oxide film interposed therebetween, a first offset transistor of MOS structure which is of a first conductivity type and disposed in the SOI substrate, and a second offset transistor of MOS structure which is of a second conductivity type and disposed in the SOI substrate, the method comprising the steps of diffusing an impurity into a predetermined position in the first substrate to simultaneously form a source base diffusion layer of the second conductivity type of the first transistor and a drain offset diffusion layer of the second conductivity type of the second transistor, diffusing an impurity into a predetermined position in the first substrate to simultaneously form a source diffusion layer and a drain offset diffusion layer which are of the first conductivity type of the first transistor and a source diffusion layer of the first conductivity type of the second transistor, simultaneously forming a field oxide film doubling as a gate oxide film of the first transistor and a field oxide film of the second transistor on an upper surface of the first substrate, forming a thermal oxide film and an electrically conductive film on the field oxide films on an entire upper surface of the first substrate, patterning the thermal oxide film and the electrically conductive film to form a gate oxide film of the second transistor with the thermal oxide film and gate electrodes of the first and second transistors with the electrically conductive film, diffusing an impurity into a predetermined position in the first substrate to form source contact diffusion layers and drain contact diffusion layers of the first and second transistors, forming a trench in a predetermined position in the first substrate and filling the trench with a laminated oxide film to isolate the first and second transistors from each other, and forming contact holes in predetermined positions in the first substrate and connecting electrodes through the contact holes to the contact diffusion layers.

In the first transistor, therefore, the dedicated source base diffusion layer separate from the source diffusion layer is positioned in the first substrate, and the drain base layer joined to the source base diffusion layer is positioned in the first substrate. Since the drain base layer functions in the same manner as the drain offset diffusion layer, the first transistor has a stably high breakdown voltage and a low on-state resistance as with the second transistor.

The upper surface of the substrate or the like referred to in this description means a surface of the substrate or the like on which a layer or a film is formed, and may not necessarily be oriented upwardly in reality when the semiconductor device is fabricated or used.

The method described above further comprises the step of diffusing the impurity from the surface of the first substrate to a surface of the embedded oxide film thereby to form the source base diffusion layer of the second conductivity type of the first transistor and the drain offset diffusion layer of the second conductivity type of the second transistor.

Thus, the source base diffusion layer of the first transistor and the drain offset diffusion layer of the second transistor which are forming by diffusing impurities into the first substrate are formed stably to constant shape.

The above and other objects, features and advantages of the present invention will become apparent from the following description with reference to the accompanying drawings which illustrate examples of the present invention.

BRIEF DESCRIPTION OF THE DRAWINGS

FIGS. 5(a) and 5(b) are fragmentary vertical cross-sectional views illustrative of seventh and eighth steps of the process of fabricating the CMOS circuit shown in FIG. 1;

FIGS. 7(a) and 7(b) are fragmentary vertical cross-sectional views illustrative of first and second steps of a process of fabricating the CMOS circuit shown in FIG. 6;

FIGS. 9(a) and 9(b) are fragmentary vertical cross-sectional views illustrative of fifth and sixth steps of the process of fabricating the CMOS circuit shown in FIG. 6;

FIG. 11 is a diagram showing the relationship between offset lengths and breakdown voltages of the CMOS circuit according to the present invention and the conventional CMOS circuit.

DETAILED DESCRIPTION OF THE PREFERRED EMBODIMENTS

Figure 1:
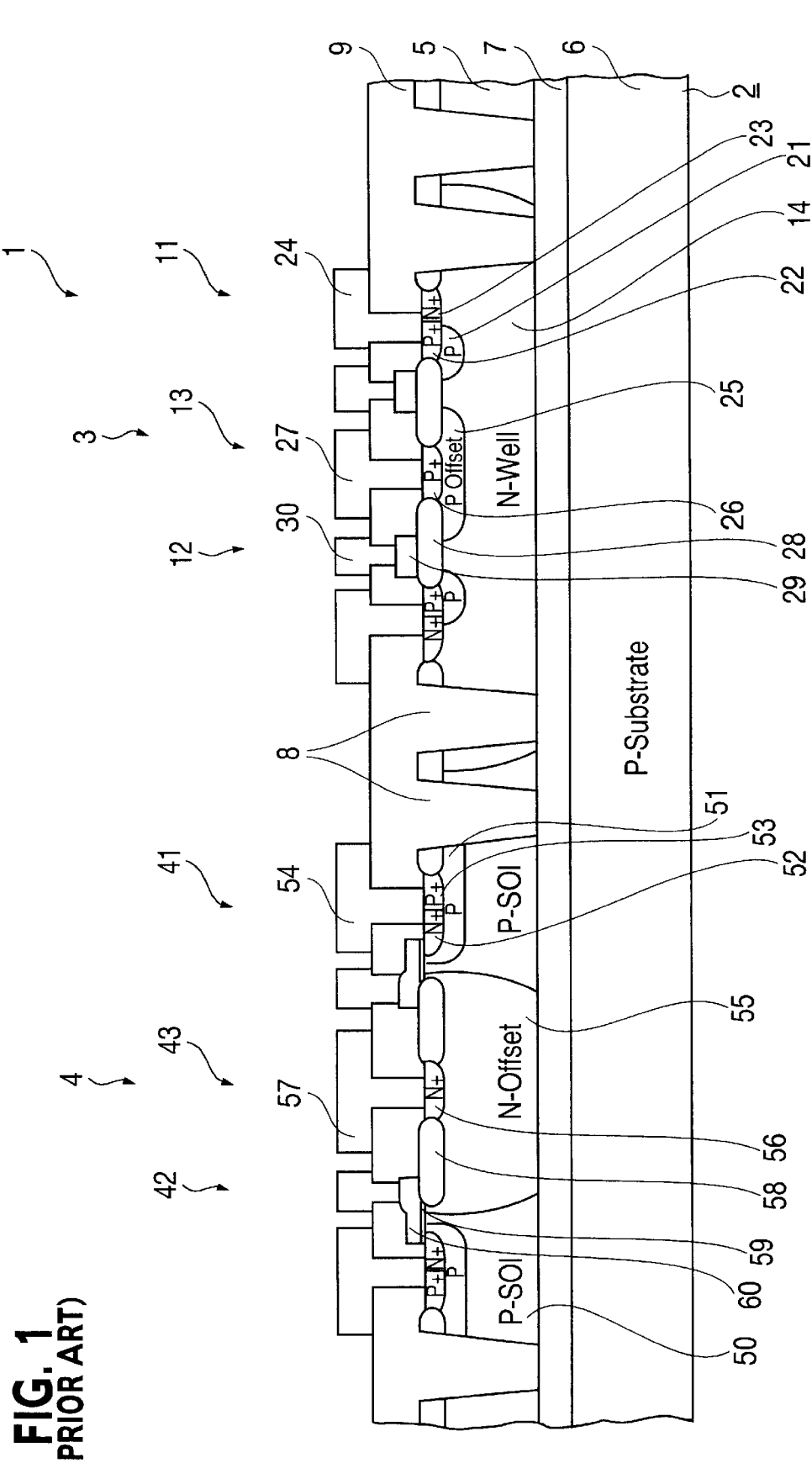
FIG. 1 is a fragmentary vertical cross-sectional view showing a multilayer structure of a CMOS circuit as a conventional semiconductor device.
Figure 2A:
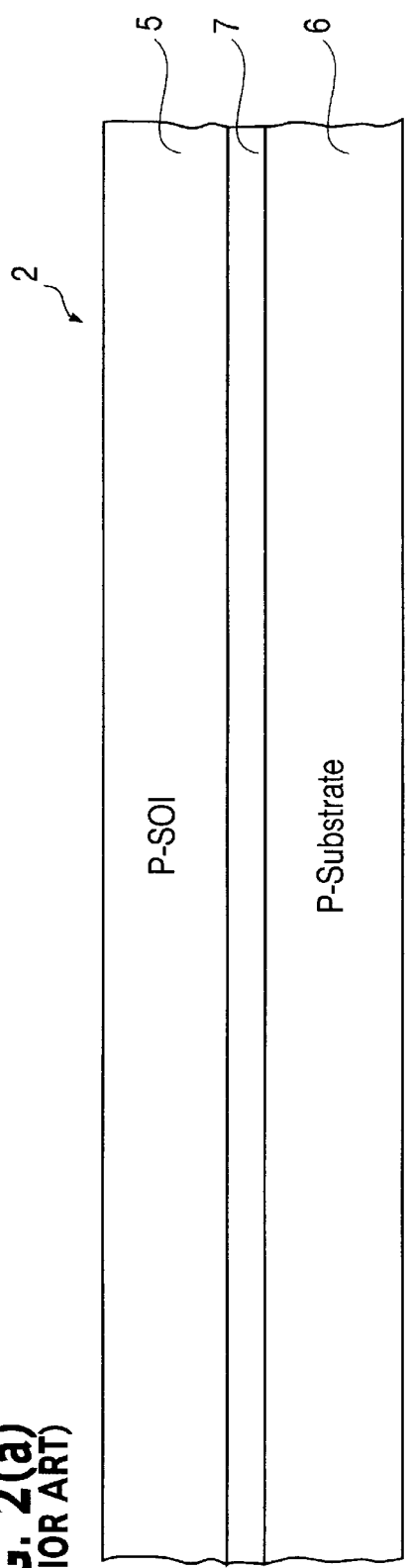
FIGS. 2(a) and 2(b) are fragmentary vertical cross-sectional views illustrative of first and second steps of a process of fabricating the CMOS circuit shown in FIG. 1.
Figure 2B:
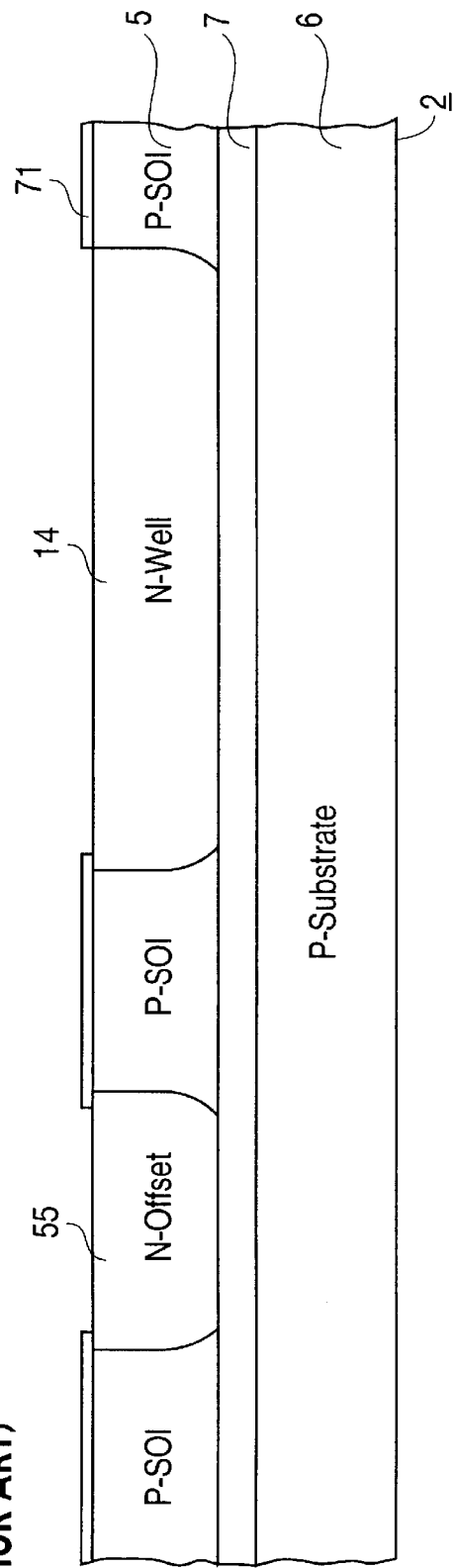
Figure 3A:
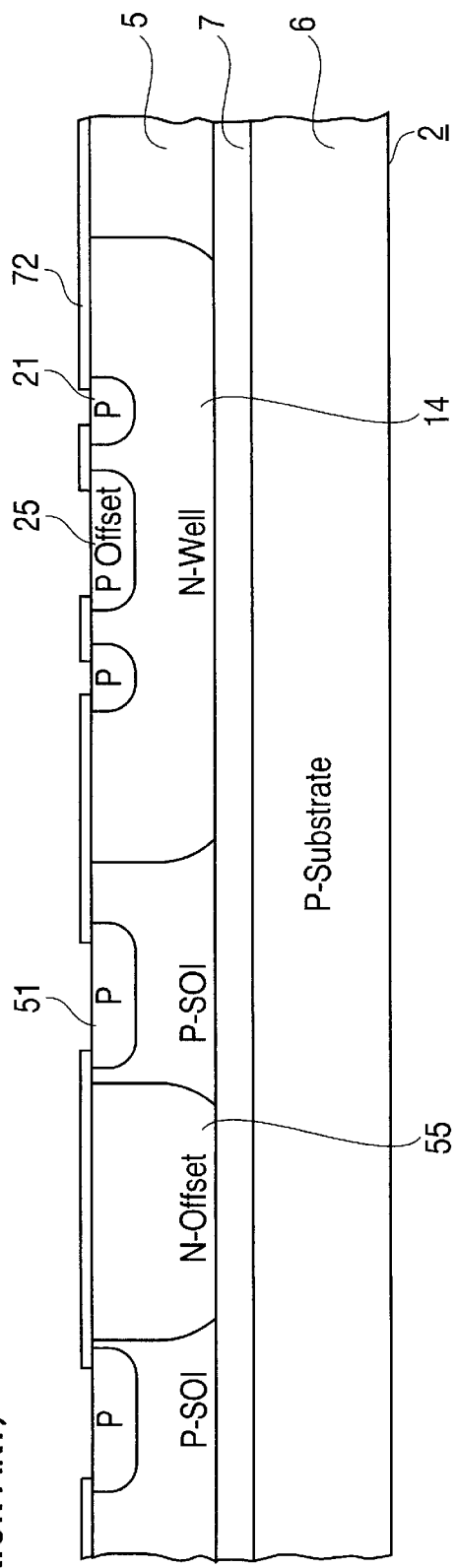
FIGS. 3(a) and 3(b) are fragmentary vertical cross-sectional views illustrative of third and fourth steps of the process of fabricating the CMOS circuit shown in FIG. 1.
Figure 3B:
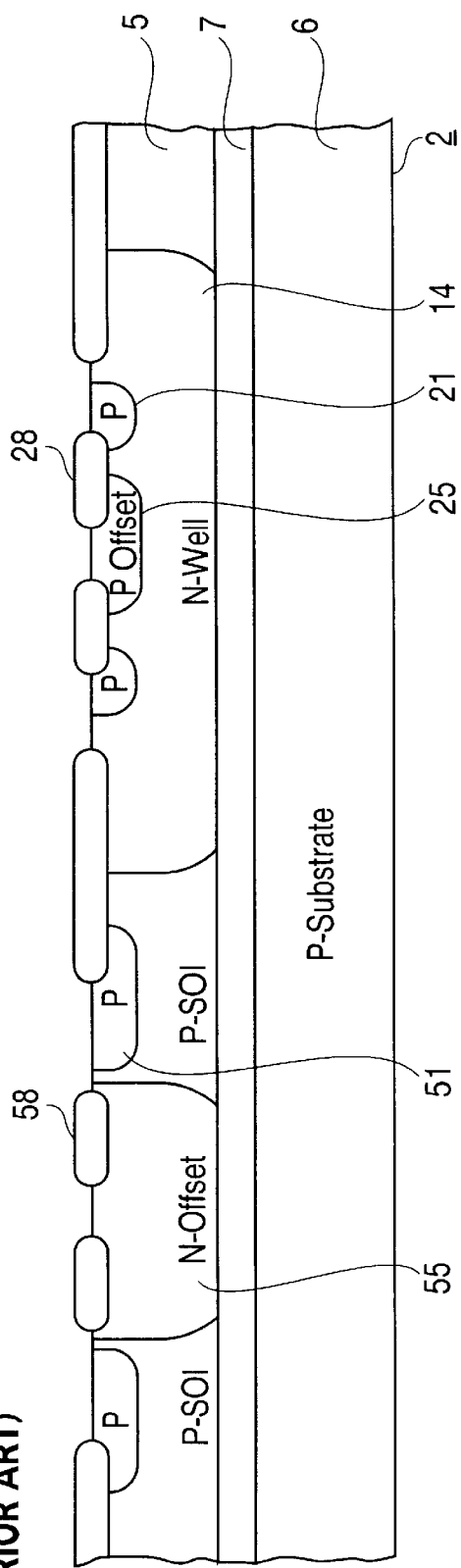
Figure 4A:
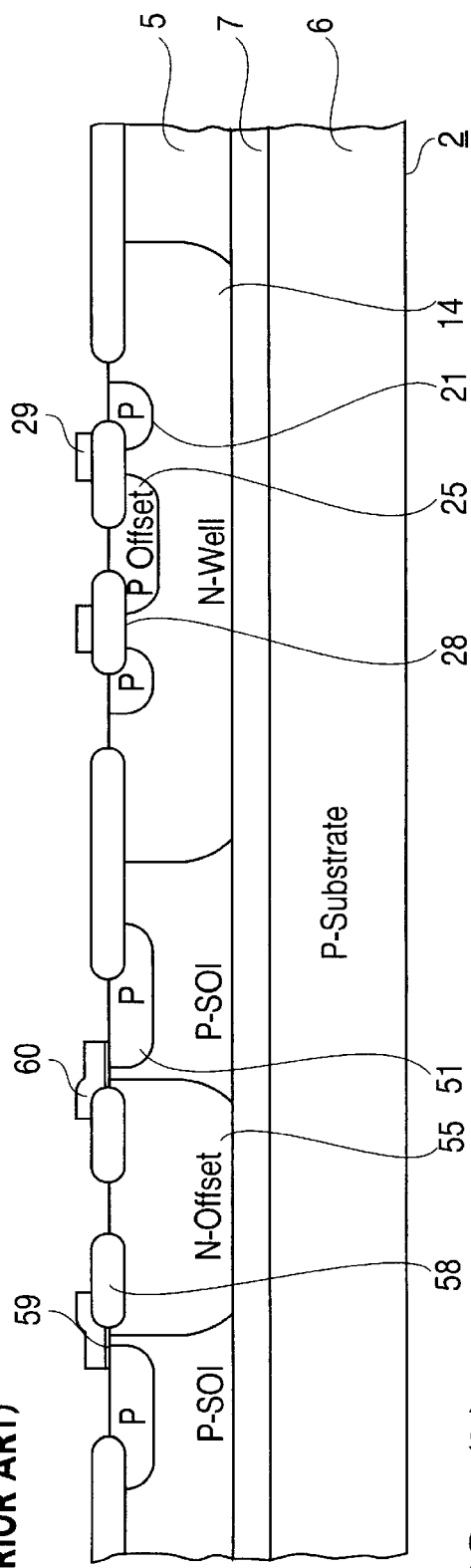
FIGS. 4(a) and 4(b) are fragmentary vertical cross-sectional views illustrative of fifth and sixth steps of the process of fabricating the CMOS circuit shown in FIG. 1.
Figure 4B:
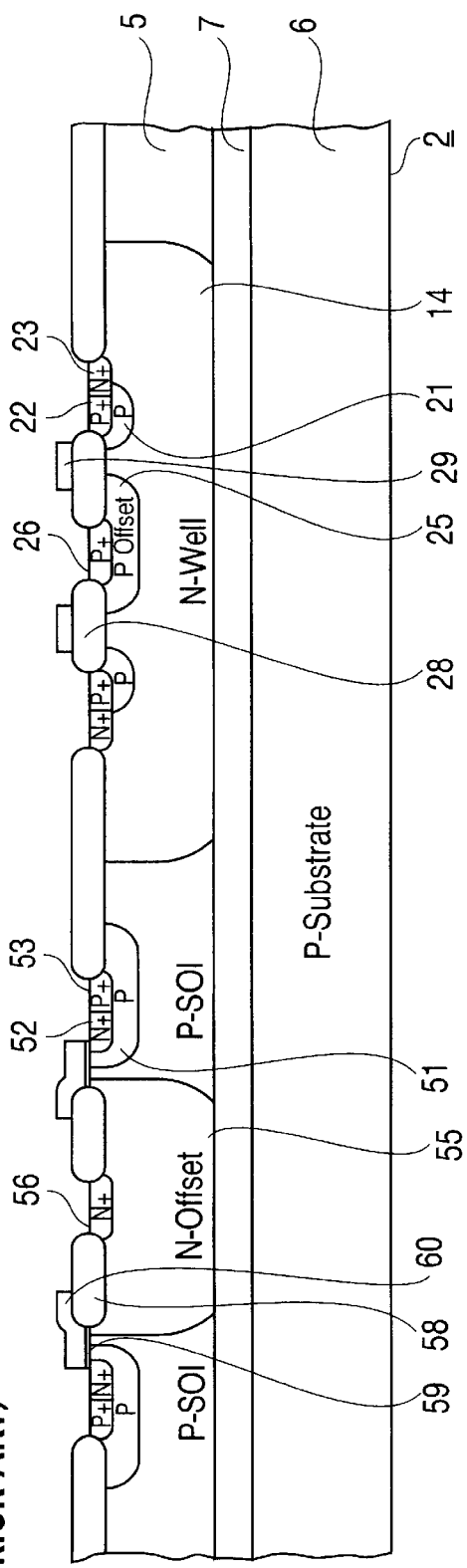

A semiconductor device according to the present invention and a method of fabricating such a semiconductor device will be described below with reference to FIGS. 6 through 11. Those parts of the semiconductor device which are identical to those of the conventional semiconductor device shown in FIGS. 1 through 5(b) are represented by identical reference numerals, and will not be described in detail below.

Figure 6:
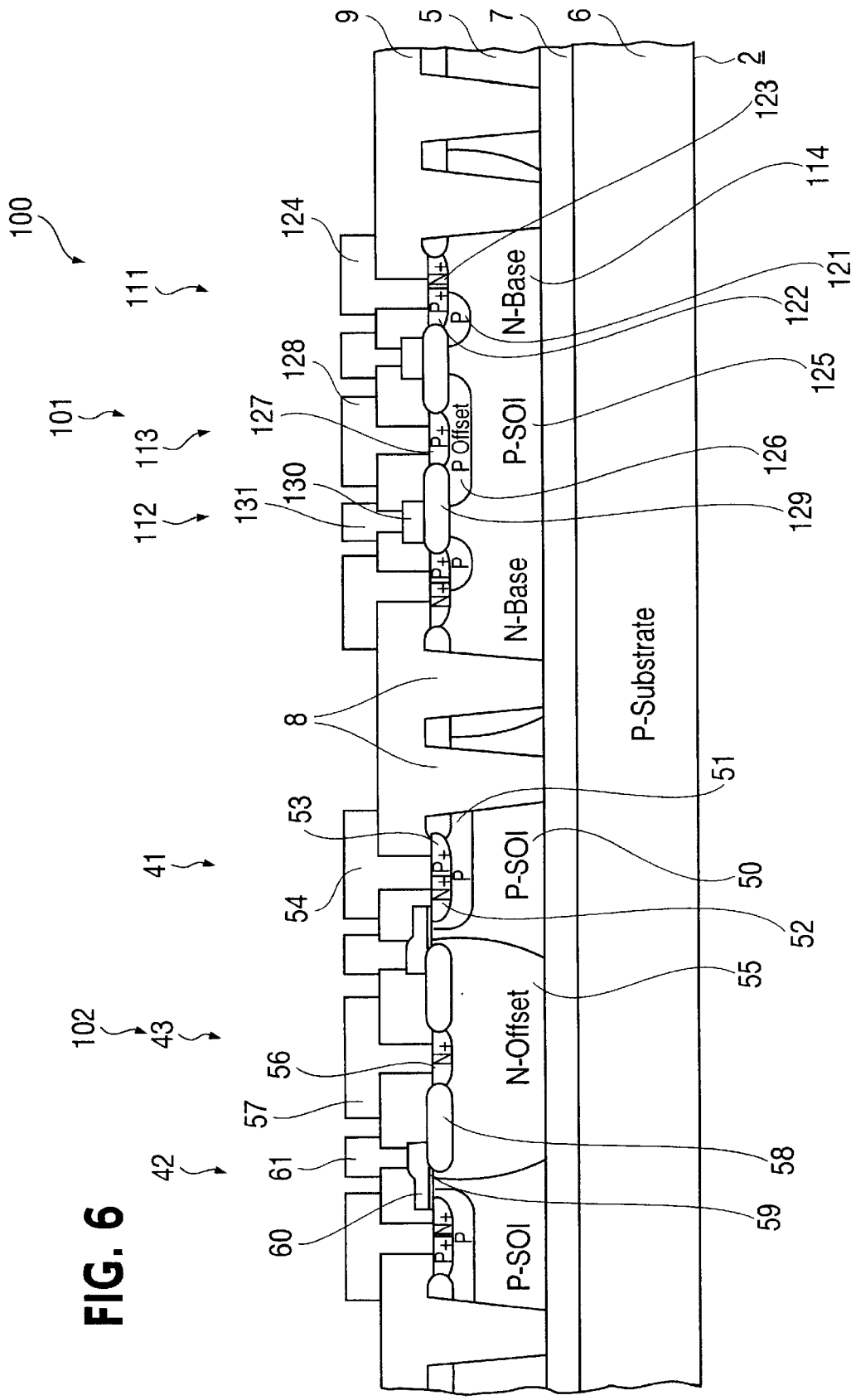
FIG. 6 is a fragmentary vertical cross-sectional view showing a multilayer structure of a CMOS circuit as a semiconductor device according to the present invention.

FIG. 6 is a fragmentary vertical cross-sectional view showing a multilayer structure of a CMOS circuit as the semiconductor device according to the present invention, and FIGS. 7(a) through 10(b) are fragmentary vertical cross-sectional views illustrative of successive steps of a process of fabricating the CMOS circuit shown in FIG. 6. FIG. 11 is a diagram showing the relationship between offset lengths and breakdown voltages of a P-channel first transistor of LDMOS (Lateral Double-diffused MOS) structure of the CMOS circuit according to the present invention and a P-channel first transistor of LMOS structure of a conventional CMOS circuit.

The CMOS circuit according to the present invention is schematically illustrated in order to clarify the multilayer structure thereof. Though the illustrated positional relationship between various layers and films in the direction in which they are deposited reflects the actual structure, the dimensional relationship between those layers and films differs from the actual circuit.

The semiconductor device according to the present invention will be described on the assumption that layers are successively formed on an SOI substrate in an upward direction. Such a direction is employed by way of example only for the sake of brevity, and will not limit any direction in which the semiconductor device is actually fabricated and used. Layers or films with a higher concentration are indicated by $P^+$ and $N^+$, and those with a lower concentration are indicated by $P^-$ and $N^-$. In FIGS. 6 through 10(b) and other figures, "P+", "N+", "P–", "N–" should be construed to mean "$P^+$", "$N^+$", "$P^-$", "$N^-$", respectively.

As shown in FIG. 6, a CMOS circuit 100 has a single SOI substrate 2 of a P-type which is a first conductivity type. On the SOI substrate 2, there are disposed a P-channel first transistor 101 of the first conductivity type and an N-channel second transistor 102 of a second conductivity type. Each of the first and second transistors 101, 102 is of an offset structure. Unlike the conventional CMOS circuit 1 shown in FIG. 1, however, the second transistor 102 is of an LMOS structure, and the first transistor 101 is of an LDMOS structure.

The SOI substrate 2 comprises first and second substrates 5, 6 each of the $P^-$-type which is the first conductivity type. The first and second substrates 5, 6 are integrally joined to each other by an embedded oxide film 7. The first and second transistors 101, 102 are disposed in only the first substrate 5 that is positioned above the embedded oxide film 7. The first and second transistors 101, 102 are isolated from each other by a trench 8 and a laminated oxide film 9.

The P-channel first transistor 101 comprises a source 111, a gate 112 positioned inside of the source 111, and a drain 113 positioned centrally therein. The source 111 has an $N^-$-type source base diffusion layer 114 disposed in the first substrate 5.

The source 111 of the first transistor 3 comprises a P-type source diffusion layer 121 positioned on the source base diffusion layer 114, a $P^+$-type source contact diffusion layer 122 positioned on an upper surface of the P-type source diffusion layer 121, and an $N^+$-type back-gate contact diffusion layer 123 positioned on the $N^-$-type source base diffusion layer 114 outside of the $P^+$-type source contact diffusion layer 122. A source electrode 124 is positioned on the contact diffusion layers 122, 123.

The drain 113 of the first transistor 101 comprises a drain base layer 125 positioned in the $P^-$-type first substrate 5, a P-type drain offset diffusion layer 126 positioned on the drain base layer 125, and a $P^+$-type drain contact diffusion layer 127 positioned centrally on an upper surface of the drain offset diffusion layer 126. A drain electrode 128 is positioned on an upper surface of the $P^+$-type drain contact diffusion layer 127.

The drain offset diffusion layer 126 and the source diffusion layer 121 project from the respective contact diffusion layers 127, 122 toward the gate 112, and a field oxide film 129 doubling as 15 a gate oxide film is positioned on upper surfaces of the offset regions of the drain offset diffusion layer 126 and the source diffusion layer 121. A gate electrode 130 is positioned on an upper surface of the field oxide film 129, and a gate extension 20 electrode 131 is positioned on an upper surface of the gate electrode 130.

The N-channel second transistor 102 is disposed in juxtaposed relation to the P-channel first transistor 101. The N-channel second transistor 102 25 is structurally identical to the N-channel second transistor 4 of the conventional CMOS circuit shown in FIG. 1. Those parts of the N-channel second transistor 102 which are identical to those of the N-channel second transistor 4 are denoted by identical reference numerals, and will not be described in detail below.

In the CMOS circuit 100 of the above structure, both the P-channel first transistor 101 and the N-channel second transistor 102 are of an offset structure. The second transistor 102 is of an LMOS structure, and the first transistor 101 is of an LDMOS structure. Therefore, the first transistor 101 has an increased breakdown voltage and a reduced on-state resistance.

The reasons for the increased breakdown voltage and the reduced on-state resistance will be described below. As described above, the breakdown voltage of the offset-type transistors 101, 102 is governed by the joined state between the drain offset diffusion layers 126, 55 and the source base (diffusion) layers 50, 114. In the CMOS circuit 100, the drain base layer 125 in the form of the $P^-$-type first substrate 5 is integrally joined to the drain offset diffusion layer 126, and these two layers 125, 126 function as a single drain offset diffusion layer.

The drain base layer 125 which comprises the $P^-$-type first substrate 5 is joined to the $N^-$-type source base diffusion layer 114 which is formed by diffusing an impurity of phosphorus or the like into the first substrate 5. Therefore, since the impurity is diffused only once to form the source base diffusion layer 114, the breakdown voltage of the first transistor 101 is stable.

The breakdown voltage of the first transistor 101 is also governed by the radius of curvature of the joined boundary between the drain base layer 125 and the source base diffusion layer 114. Inasmuch as the drain offset diffusion layer composed of the layers 125, 126 is as deep as the drain offset diffusion layer 55 of the second transistor 102, the radius of curvature of the joined boundary between the drain base layer 125 and the source base diffusion layer 114 is large, thus stabilizing the breakdown voltage of the first transistor 101.

The inventor fabricated samples of the conventional CMOS circuit 1 and the CMOS circuit 100 according to the present invention, and measured the relationship between offset lengths and breakdown voltage of the first transistors 3, 101 thereof. As shown in FIG. 11, with the conventional structure, the breakdown voltage was saturated at about 280 V even when the offset length increased to 18 μm. With the structure according to the present invention, if the breakdown voltage was about 280 V, then the offset length was about 13 μm, and if the offset length increased to about 16 μm, then the breakdown voltage was 300 V or higher.

Since the breakdown voltage of the first transistor 101 of the CMOS circuit 100 is high due to its structure, the first transistor 101 may be reduced in size and hence the area occupied thereby may be reduced. Accordingly, the chip area of the CMOS circuit 100 may be reduced, and the amount of the material of the SOI substrate 2 which is complex in structure and expensive may be cut down.

For example, with the conventional CMOS circuit 1, the first transistor 3 occupied 40% of the entire area of the CMOS circuit. With the CMOS circuit 100, however, the area occupied by the first transistor 101 may be reduced to the area occupied by the first transistor 3 of the conventional CMOS circuit 1, and hence overall area of the first transistor 101 may be reduced about 20%.

Furthermore, since the first transistor 101 has a drain current that flows through the drain offset diffusion layer which is as wide and deep as the drain offset diffusion layer 55 of the second transistor 102, the on-state resistance of the first transistor 101 is relatively low. For example, if the breakdown voltage of the first transistor 101 is the same as that of the first transistor 3 of the conventional CMOS circuit 1, then the on-state resistance of the first transistor 101 is about half the on-state resistance of the first transistor 3.

In summary, both the first and second transistors 101, 102 of offset structure have a stable and high breakdown voltage, occupy a relatively small area, and have a small on-state resistance to the drain current. Consequently, the CMOS circuit 100 can be used as a high-performance, small-size drive circuit for a plasma display panel, for example.

With the CMOS circuit 100, since the source base diffusion layer 114 of the first transistor 101 of LDMOS structure and the drain offset diffusion layer 50 of the second transistor 102 can simultaneously be formed, the number of steps of a process of fabricating the CMOS circuit 100 is not made larger than the number of steps of the process of fabricating the conventional CMOS circuit 1.

A process of fabricating the CMOS circuit 100 will briefly be described below with reference to FIGS. 7(a) through 10(b).

As shown in FIG. 7(a), first and second substrates 5, 6 of P⁻-type silicon are integrally joined to each other by an embedded oxide film 7 in the form of an SiO₂ film having a thickness of about 2 μm. The first substrate 5 is ground to a thickness of about 5 μm, thus producing a single SOI substrate 2.

Then, as shown in FIG. 7(b), a mask 141 of predetermined shape is formed on an upper surface of the first substrate 5. An impurity of phosphorus is introduced into the first substrate 5 through openings of the mask 141 by ion implantation. The assembly is heated to diffuse the introduced phosphorus down to the upper surface of the embedded oxide film 7, for thereby simultaneously forming an N⁻-type source base diffusion layer 114 of a first transistor 101 and a drain offset diffusion layer 55 of a second transistor 102.

Figure 8A:
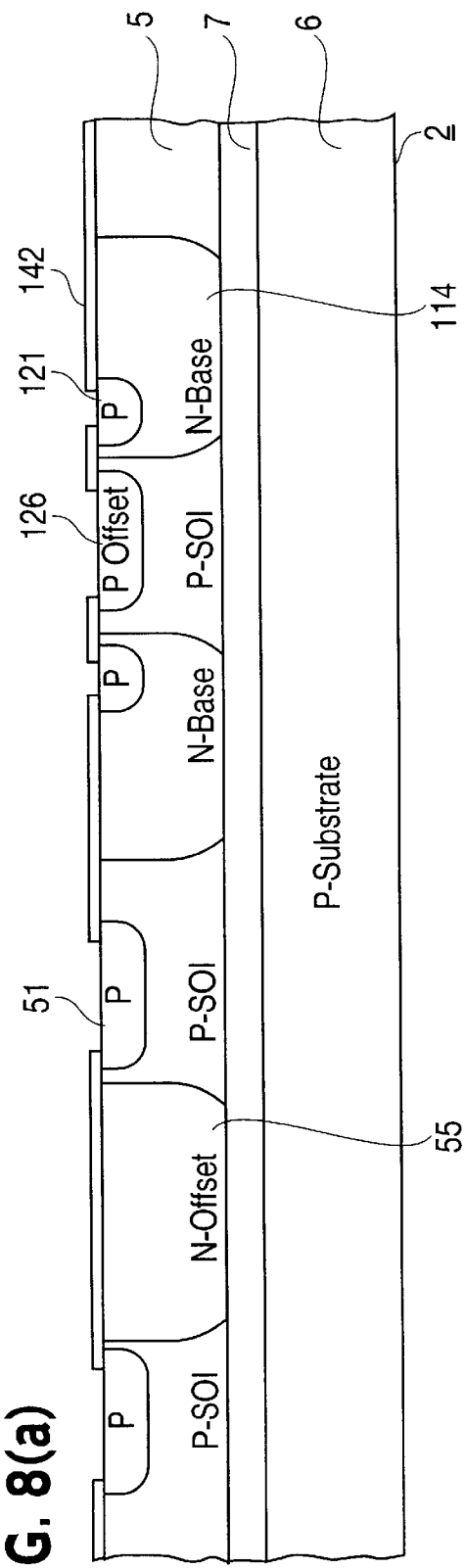
FIGS. 8(a) and 8(b) are fragmentary vertical cross-sectional views illustrative of third and fourth steps of the process of fabricating the CMOS circuit shown in FIG. 6.
Figure 8B:
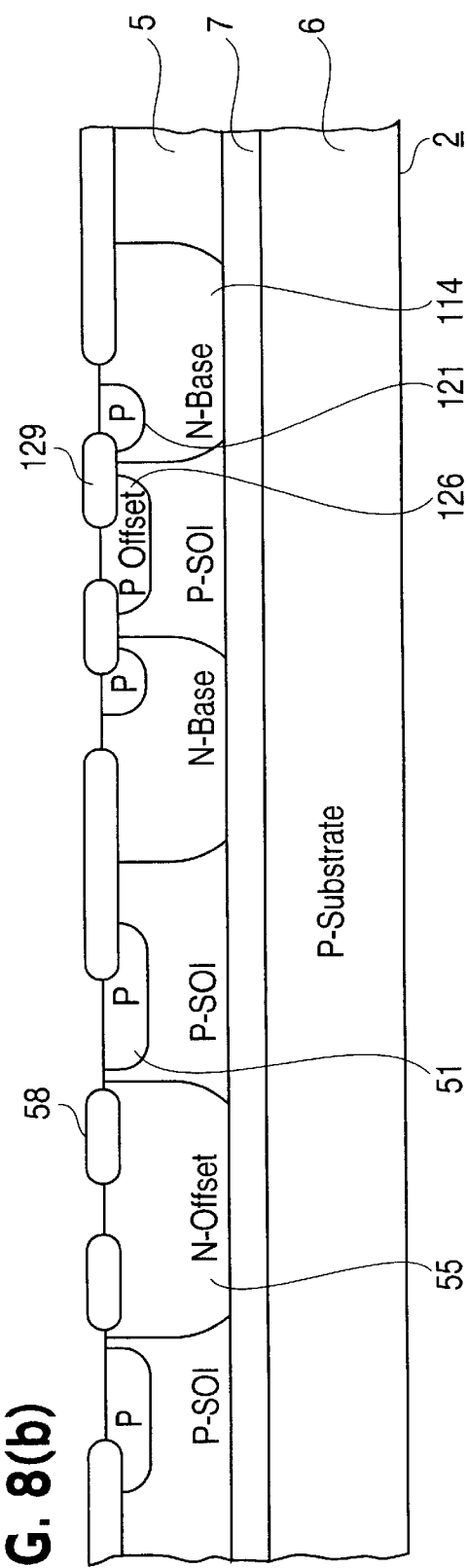

Then, as shown in FIG. 8(a), after the mask 141 is removed, a mask 142 of another shape is formed. An impurity of boron is then introduced into the first substrate 5 through openings of the mask 141 by ion implantation. The assembly is heated to diffuse the introduced boron to a depth ranging from 1 to 2 μm from the surface of the first substrate 5, for thereby simultaneously forming a P-type source diffusion layer 121 and a drain offset diffusion layer 126 of the first transistor 101 and a source shield diffusion layer 51 of the second transistor 102. Thereafter, as shown in FIG. 8(b), the mask 142 is removed, and then field oxide films 129, 58 are formed to a thickness ranging from 0.5 to 1.0 μm by LOCOS.

A thermal oxide film and a polysilicon film are formed on the entire surface formed thus far according to CVD, and an impurity of phosphorus is diffused to make the polysilicon film electrically conductive. As shown in FIG. 9(a), the electrically conductive polysilicon film and the thermal oxide film are then patterned at the same time, thus forming a gate oxide film 59 of the second transistor 102 with the thermal oxide film and gate electrodes 130, 60 of the first and second transistors 101, 102 with the electrically conductive polysilicon film.

Masks of predetermined shape (not shown) are then formed, and phosphorus and boron are introduced into various regions thereby to form contact diffusion layers 122, 123, 127, 52, 53, 56 of the first and second transistors 101, 102 as shown in FIG. 9(b).

Figure 10A:
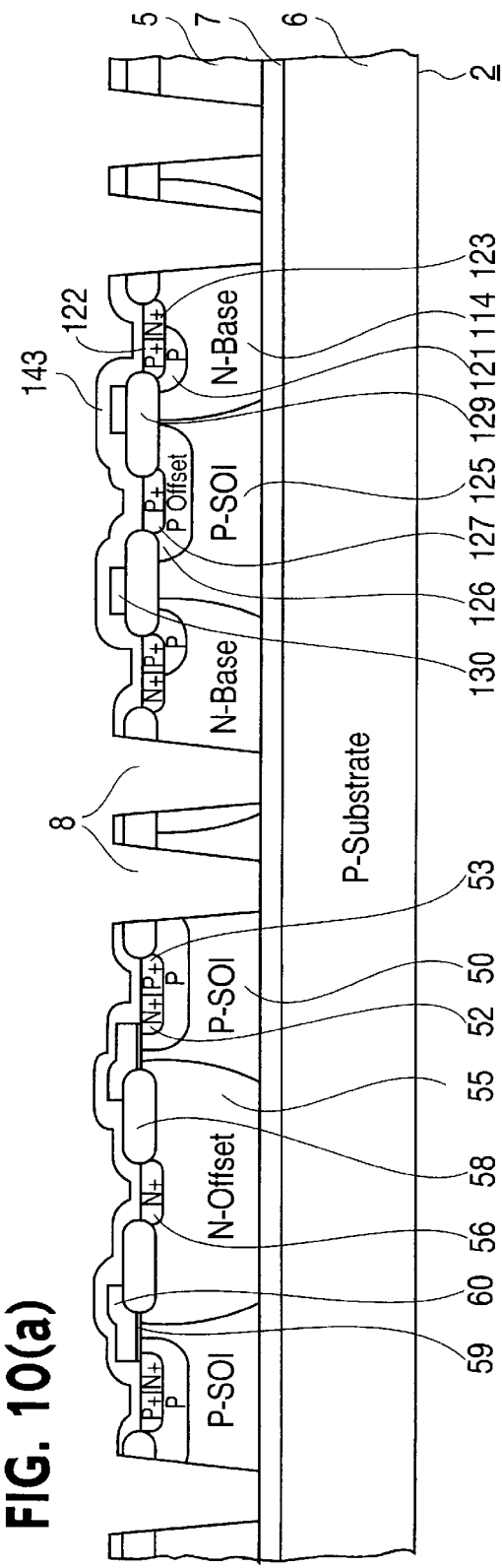
FIGS. 10(a) and 10(b) are fragmentary vertical cross-sectional views illustrative of seventh and eighth steps of the process of fabricating the CMOS circuit shown in FIG. 6.
Figure 10B:
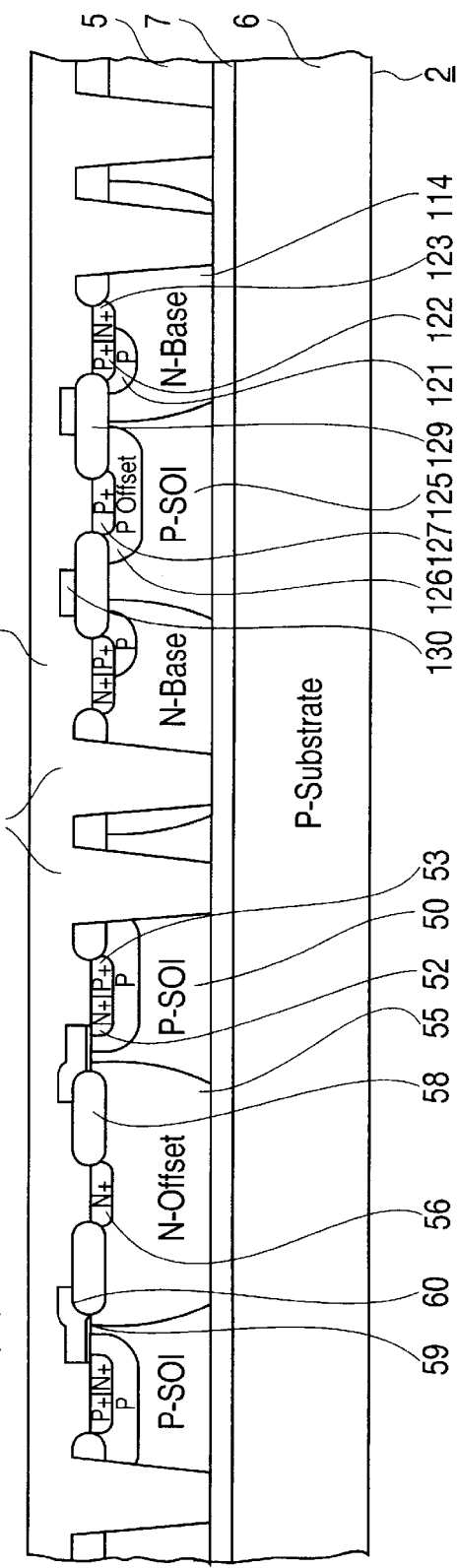

Then, as shown in FIG. 10(a), an oxide film having a thickness of 100 nm is formed by CVD and patterned into a mask 143. Thereafter, trenches 8 are formed around the first and second transistors 101, 102 by silicon etching through the mask 143. As shown in FIG. 10(b), a laminated oxide film 9 is deposited to a thickness ranging from 1 to 2 μm in order to fill up the trenches 8, thus isolating the first and second transistors 101, 102 from each other.

Thereafter, as shown in FIG. 6, contact holes are defined in various regions in the laminated oxide film 9, and electrodes 124, 128, 131, 54, 57, 61 of the first and second transistors 101, 102 are formed to a thickness ranging from 0.5 to 2.0 μm by sputtering aluminum or the like. In this manner, a CMOS circuit 100 is completed.

The source base diffusion layer 114 and the drain base layer 125 of the first transistor 101 of the CMOS circuit 100 according to the present invention are structurally larger than the first transistor 3 of the conventional CMOS circuit 1.

According to the process of fabricating the CMOS circuit 100, the source base diffusion layer 114 and the drain base layer 125 of the first transistor 101 are formed simultaneously with the drain offset diffusion layer 55 and the source base layer 50 of the second transistor 102. Therefore, no additional step is needed to form the source base diffusion layer 114 and the drain base layer 125, and hence the productivity of the CMOS circuit 100 is not reduced.

In the illustrated embodiment, the P-channel first transistor 101 of LMOS structure and the N-channel second transistor 102 of LDMOS structure are formed in the P-type SOI substrate 2. However, an N-channel first transistor of LDMOS structure and a P-channel second transistor of LMOS structure may be formed in an N-type substrate.

While the first substrate 5 has a thickness of 5 μm and the embedded oxide layer 7 has a thickness of 2 μm in the illustrated embodiment, they may be set to different thicknesses. As the thicknesses of the first substrate 5 and the embedded oxide layer 7 increase, the breakdown voltage of the transistors 101, 102 increase. However, if the thickness of the first substrate 5 increases, then it is difficult to form and fill the trenches 8, and if the thickness of the embedded oxide layer 7 increases, the SOI substrate 2 has increased warpage, making it difficult to increase the level of circuit integration.

Therefore, it is preferable to appropriately set the thicknesses of the first substrate 5 and the embedded oxide layer 7 in view of desired performance levels and device specifications. Practically, it is preferable that the thickness of the first substrate 5 be in the range of from 3 to 10 $\mu$m and the thickness of the embedded oxide layer 7 be in the range of from 1 to 3 $\mu$m.

The thicknesses of the gate oxide film 59 and the field oxide film 129 doubling as a gate oxide film should preferably be increased in order to increase the breakdown voltage of the first and second transistors 101, 102. However, these oxide films 59, 129 should preferably be not too thick insofar as they have required thicknesses.

If the trenches 8 are narrower, the circuit area may be smaller and the trenches 8 may be filled more easily with the laminated oxide film 9. The dimensions of the trenches 8 depend on the etching technology, and each of the trenches 8 has an aspect ratio (depth to width)=5:1 according to the present level of etching technology.

The laminated oxide film 9 may be thicker from the standpoint of the dielectric strength. However, the laminated oxide film 9 should preferably be of a suitable thickness to allow contact holes to be defined easily therein. In order that the laminated oxide film 9 will be as flat as possible, it should preferably be formed by depositing an insulating material several times, depositing an insulating material while it is being etched back, or depositing an insulating material all at once and then grinding the deposited insulating material.

When the electrodes 124, 128, 131, 54, 57, 61 are to formed of metal, if the contact holes are small, then the contact holes may first be filled with tungsten by sputtering, and then the electrodes may be formed of aluminum. The electrodes 124, 128, 131, 54, 57, 61 of metal which are thicker are larger in capacity and more advantageous for the passage of larger currents therethrough. However, the thickness of the electrodes should be set to a suitable value from the standpoint of microstructure processing.

The semiconductor device according to the present invention offers the following advantages:

According to a first aspect of the present invention, there is provided a semiconductor device of CMOS structure comprising an SOI substrate composed of first and second substrates of a first conductivity type which are integrally joined to each other by an embedded oxide film interposed therebetween, and a pair of offset transistors of MOS structure which are of first and second conductivity types, respectively, the transistors being disposed in the SOI substrate and isolated from each other, the transistor of the second conductivity type being of an LMOS structure, the transistor of the first conductivity type being of an LDMOS structure. Consequently, the transistor of the first conductivity type has a stably high breakdown voltage and a low on-state resistance as with the transistor of the second conductivity type, and takes up a reduced area. Therefore, the semiconductor device is small in size, inexpensive to manufacture, and high in performance level.

According to a second aspect of the present invention, the transistor of the second conductivity type comprises a source base layer of the first conductivity type composed of the first substrate, a source contact diffusion layer of the second conductivity type positioned on the source base layer, a gate oxide film positioned on ends of the source contact diffusion layer and the source base layer, and a drain offset diffusion layer of the second conductivity type disposed in the first substrate and extending underneath the gate oxide film, and the transistor of the first conductivity type comprises a source base diffusion layer of the second conductivity type disposed in the first substrate, a source diffusion layer of the first conductivity type positioned on the source base diffusion layer, a source electrode electrically connected to the source diffusion layer, a field oxide film positioned on ends of the source diffusion layer and the source base diffusion layer and doubling as a gate oxide film, a gate electrode positioned on the field oxide film, a drain base layer of the first conductivity type composed of the first substrate, a drain offset diffusion layer of the first conductivity type positioned on the drain base layer and extending underneath the field oxide film, and a drain electrode electrically connected to the drain offset diffusion layer. Consequently, the transistor of the first conductivity type has a stably high breakdown voltage and a low on-state resistance as with the transistor of the second conductivity type, and takes up a reduced area. Therefore, the semiconductor device is small in size, inexpensive to manufacture, and high in performance level.

According to a third aspect of the present invention, the transistor of the second conductivity type comprises a source base layer of the first conductivity type composed of the first substrate, a source contact diffusion layer of the second conductivity type positioned on the source base layer, a source electrode electrically connected to the source contact diffusion layer, a gate oxide film positioned on ends of the source contact diffusion layer and the source base layer, a gate electrode positioned on the gate oxide film, a drain offset diffusion layer of the second conductivity type disposed in the first substrate and extending underneath the gate oxide film, and a drain electrode electrically connected to the drain offset diffusion layer, and the transistor of the first conductivity type comprises a source base diffusion layer of the second conductivity type disposed in the first substrate, a source diffusion layer of the first conductivity type positioned on the source base diffusion layer, a source electrode electrically connected to the source diffusion layer, a field oxide film positioned on ends of the source diffusion layer and the source base diffusion layer and doubling as a gate oxide film, a gate electrode positioned on the field oxide film, a drain base layer of the first conductivity type composed of the first substrate, a drain offset diffusion layer of the first conductivity type positioned on the drain base layer and extending underneath the field oxide film, and a drain electrode electrically connected to the drain offset diffusion layer. Consequently, the transistor of the first conductivity type has a stably high breakdown voltage and a low on-state resistance as with the transistor of the second conductivity type, and takes up a reduced area. Therefore, the semiconductor device is small in size, inexpensive to manufacture, and high in performance level.

According to a fourth aspect of the present invention, there is provided a semiconductor device of CMOS structure comprising an SOI substrate composed of first and second substrates of a first conductivity type which are integrally joined to each other by an embedded oxide film interposed therebetween, and a pair of offset transistors of MOS structure which are of first and second conductivity types, respectively, the transistors being disposed in the SOI substrate and isolated from each other, the transistor of the second conductivity type comprising a source base layer of the first conductivity type composed of the first substrate, a source shield diffusion layer of the first conductivity type positioned on the source base layer, a source contact diffusion layer of the second conductivity type positioned on the source shield diffusion layer, a back-gate contact diffusion layer of the first conductivity type positioned on the source shield diffusion layer adjacent to the source contact diffusion layer, a source electrode positioned on the back-gate contact diffusion layer and the source contact diffusion layer, a gate oxide film positioned on ends of the source contact diffusion layer and the source base layer, a gate electrode positioned on the gate oxide film, a gate extension electrode positioned on the gate electrode, a drain offset diffusion layer of the second conductivity type disposed in the first substrate and extending underneath the gate oxide film, a drain contact diffusion layer of the second conductivity type positioned on the drain offset diffusion layer, and a drain electrode positioned on the drain contact diffusion layer, the transistor of the first conductivity type comprising a source base diffusion layer of the second conductivity type disposed in the first substrate, a source diffusion layer of the first conductivity type positioned on the source base diffusion layer, a source contact diffusion layer of the first conductivity type positioned on the source diffusion layer, a back-gate contact diffusion layer of the second conductivity type positioned on the source base diffusion layer adjacent to the source contact diffusion layer, a source electrode positioned on the source contact diffusion layer and the back-gate contact diffusion layer, a field oxide film positioned on ends of the source diffusion layer and the source base diffusion layer and doubling as a gate oxide film, a gate electrode positioned on the field oxide film, a gate extension electrode positioned on the gate electrode, a drain base layer of the first conductivity type composed of the first substrate, a drain offset diffusion layer of the first conductivity type positioned on the drain base layer and extending underneath the field oxide film, a drain contact diffusion layer of the first conductivity type positioned on the drain offset diffusion layer, and a drain electrode positioned on the drain contact diffusion layer. Consequently, the transistor of the first conductivity type has a stably high breakdown voltage and a low on-state resistance as with the transistor of the second conductivity type, and takes up a reduced area. Therefore, the semiconductor device is small in size, inexpensive to manufacture, and high in performance level.

According to a fifth aspect of the present invention, in the semiconductor device according to the second aspect, the source base diffusion layer of the transistor of the first conductivity type and the drain offset diffusion layer of the transistor of the second conductivity type extend from a surface of the first substrate to a surface of the embedded oxide film. Consequently, in a process of fabricating the semiconductor device, when the source base diffusion layer of the transistor of the first conductivity type and the drain offset diffusion layer of the transistor of the second conductivity type are forming by diffusing impurities into the first substrate, the diffusion of the impurities are stopped at the position of the embedded oxide film. Therefore, these diffusion layers are formed stably to constant shape, and the semiconductor device has a stable level of performance.

According to a sixth aspect of the present invention, in the semiconductor device according to the third aspect, the source base diffusion layer of the transistor of the first conductivity type and the drain offset diffusion layer of the transistor of the second conductivity type extend from a surface of the first substrate to a surface of the embedded oxide film. Consequently, in a process of fabricating the semiconductor device, when the source base diffusion layer of the transistor of the first conductivity type and the drain offset diffusion layer of the transistor of the second conductivity type are forming by diffusing impurities into the first substrate, the diffusion of the impurities are stopped at the position of the embedded oxide film. Therefore, these diffusion layers are formed stably to constant shape, and the semiconductor device has a stable level of performance.

According to a seventh aspect of the present invention, in the semiconductor device according to the fourth aspect, the source base diffusion layer of the transistor of the first conductivity type and the drain offset diffusion layer of the transistor of the second conductivity type extend from a surface of the first substrate to a surface of the embedded oxide film. Consequently, in a process of fabricating the semiconductor device, when the source base diffusion layer of the transistor of the first conductivity type and the drain offset diffusion layer of the transistor of the second conductivity type are forming by diffusing impurities into the first substrate, the diffusion of the impurities are stopped at the position of the embedded oxide film. Therefore, these diffusion layers are formed stably to constant shape, and the semiconductor device has a stable level of performance.

There is also provided in accordance with an eighth aspect of the present invention a method of fabricating a semiconductor device of CMOS structure having an SOI substrate composed of first and second substrates of a first conductivity type which are integrally joined to each other by an embedded oxide film interposed therebetween, a first offset transistor of MOS structure which is of a first conductivity type and disposed in the SOI substrate, and a second offset transistor of MOS structure which is of a second conductivity type and disposed in the SOI substrate, the method comprising the steps of diffusing an impurity into a predetermined position in the first substrate to simultaneously form a source base diffusion layer of the second conductivity type of the first transistor and a drain offset diffusion layer of the second conductivity type of the second transistor, diffusing an impurity into a predetermined position in the first substrate to simultaneously form a source diffusion layer and a drain offset diffusion layer which are of the first conductivity type of the first transistor and a source diffusion layer of the first conductivity type of the second transistor, simultaneously forming a field oxide film doubling as a gate oxide film of the first transistor and a field oxide film of the second transistor on an upper surface of the first substrate, forming a thermal oxide film and an electrically conductive film on the field oxide films on an entire upper surface of the first substrate, patterning the thermal oxide film and the electrically conductive film to form a gate oxide film of the second transistor with the thermal oxide film and gate electrodes of the first and second transistors with the electrically conductive film, diffusing an impurity into a predetermined position in the first substrate to form source contact diffusion layers and drain contact diffusion layers of the first and second transistors, forming a trench in a predetermined position in the first substrate and filling the trench with a laminated oxide film to isolate the first and second transistors from each other, and forming contact holes in predetermined positions in the first substrate and connecting electrodes through the contact holes to the contact diffusion layers.

In the first transistor, therefore, the first transistor has a stably high breakdown voltage and a low on-state resistance as with the second transistor, and takes up a reduced area. Therefore, the semiconductor device is small in size, inexpensive to manufacture, and high in performance level. Inasmuch as the drain base layer and the source base diffusion layer of the first transistor can be formed simultaneously with the drain base laser and the source base layer of the second transistor, the semiconductor device can be fabricated with good productivity.

According to a ninth aspect of the present invention, the method according to the eighth aspect further comprises the step of diffusing the impurity from the surface of the first substrate to a surface of the embedded oxide film thereby to form the source base diffusion layer of the second conductivity type of the first transistor and the drain offset diffusion layer of the second conductivity type of the second transistor.

Thus, the source base diffusion layer of the first transistor and the drain offset diffusion layer of the second transistor which are forming by diffusing impurities into the first substrate are formed stably to constant shape. It is therefore possible to fabricate the semiconductor device which has a stable level of performance.

While a preferred embodiment of the present invention has been described using specific terms, such description is for illustrative purposes only, and it is to be understood that changes and variations may be made without departing from the spirit or scope of the following claims.

What is claimed is:

1. A semiconductor device of CMOS structure comprising:
    an SOI substrate composed of first and second substrates of a first conductivity type which are integrally joined to each other by an embedded oxide film interposed therebetween; and
    a pair of offset transistors of MOS structure which are of first and second conductivity types, respectively, said transistors being disposed in said SOI substrate and isolated from each other;
    said transistor of the second conductivity type comprising a source base layer composed of said first substrate, an impurity diffused drain offset diffusion layer composed of said first substrate, and a first PN junction between said source base layer and said impurity diffused drain offset diffusion layer;
    said transistor of the first conductivity type comprising an impurity diffused source base layer composed of said first substrate, a drain base layer composed of said first substrate, and a second PN junction between said impurity diffused source base layer and said drain base layer;
    wherein said impurity diffused drain offset diffusion layer and said impurity diffused source base layer are formed at the same time by the same process so that said first PN junction and said second PN junction have an equal breakdown voltage.

2. A semiconductor device of CMOS structure comprising:
    an SOI substrate composed of first and second substrates of a first conductivity type which are integrally joined to each other by an embedded oxide film interposed therebetween; and
    a pair of offset transistors of MOS structure which are of first and second conductivity types, respectively, said transistors being disposed in said SOI substrate and isolated from each other;
    said transistor of the second conductivity type being of an LMOS structure comprising:
        a source base layer of the first conductivity type composed of said first substrate;
        a source contact diffusion layer of the second conductivity type positioned on said source base layer;
        a gate oxide film positioned on ends of said source contact diffusion layer and said source base layer; and
        a drain offset diffusion layer of the second conductivity type disposed in said first substrate and extending underneath said gate oxide film;
    said transistor of the first conductivity type comprising:
        a source base diffusion layer of the second conductivity type disposed in said first substrate;
        a source diffusion layer of the first conductivity type positioned on said source base diffusion layer;
        a source electrode electrically connected to said source diffusion layer;
        a field oxide film positioned on ends of said source diffusion layer and said source base diffusion layer and doubling as a gate oxide film;
        a gate electrode positioned on said field oxide film;
        a drain base layer of the first conductivity type composed of said first substrate;
        a drain offset diffusion layer of the first conductivity type positioned on said drain base layer and extending underneath said field oxide film; and
        a drain electrode electrically connected to said drain offset diffusion layer.

3. A semiconductor device according to claim 2, wherein said source base diffusion layer of said transistor of the first conductivity type and said drain offset diffusion layer of said transistor of the second conductivity type extend from a surface of said first substrate to a surface of said embedded oxide film.

4. A semiconductor device of CMOS structure comprising:
    an SOI substrate composed of first and second substrates of a first conductivity type which are integrally joined to each other by an embedded oxide film interposed therebetween; and
    a pair of offset transistors of MOS structure which are of first and second conductivity types, respectively, said transistors being disposed in said SOI substrate and isolated from each other;
    said transistor of the second conductivity type comprising:
        a source base layer of the first conductivity type composed of said first substrate;
        a source contact diffusion layer of the second conductivity type positioned on said source base layer;
        a source electrode electrically connected to said source contact diffusion layer;
        a gate oxide film positioned on ends of said source contact diffusion layer and said source base layer;
        a gate electrode positioned on said gate oxide film;
        a drain offset diffusion layer of the second conductivity type disposed in said first substrate and extending underneath said gate oxide film; and
        a drain electrode electrically connected to said drain offset diffusion layer;
    said transistor of the first conductivity type comprising:
        a source base diffusion layer of the second conductivity type disposed in said first substrate;
        a source diffusion layer of the first conductivity type positioned on said source base diffusion layer;
        a source electrode electrically connected to said source diffusion layer;
        a field oxide film positioned on ends of said source diffusion layer and said source base diffusion layer and doubling as a gate oxide film;
        a gate electrode positioned on said field oxide film;
        a drain base layer of the first conductivity type composed of said first substrate;

a drain offset diffusion layer of the first conductivity type positioned on said drain base layer and extending underneath said field oxide film; and a drain electrode electrically connected to said drain offset diffusion layer.

5. A semiconductor device according to claim 4, wherein said source base diffusion layer of said transistor of the first conductivity type and said drain offset diffusion layer of said transistor of the second conductivity type extend from a surface of said first substrate to a surface of said embedded oxide film.

6. A semiconductor device of CMOS structure comprising:

an SOI substrate composed of first and second substrates of a first conductivity type which are integrally joined to each other by an embedded oxide film interposed therebetween; and a pair of offset transistors of MOS structure which are of first and second conductivity types, respectively, said transistors being disposed in said SOI substrate and isolated from each other;

said transistor of the second conductivity type comprising:

a source base layer of the first conductivity type composed of said first substrate;

a source shield diffusion layer of the first conductivity type positioned on said source base layer;

a source contact diffusion layer of the second conductivity type positioned on said source shield diffusion layer;

a back-gate contact diffusion layer of the first conductivity type positioned on said source shield diffusion layer adjacent to said source contact diffusion layer;

a source electrode positioned on said backgate contact diffusion layer and said source contact diffusion layer;

a gate oxide film positioned on ends of said source contact diffusion layer and said source base layer;

a gate electrode positioned on said gate oxide film;

a gate extension electrode positioned on said gate electrode;

a drain offset diffusion layer of the second conductivity type disposed in said first substrate and extending underneath said gate oxide film;

a drain contact diffusion layer of the second conductivity type positioned on said drain offset diffusion layer; and a drain electrode positioned on said drain contact diffusion layer;

said transistor of the first conductivity type comprising:

a source base diffusion layer of the second conductivity type disposed in said first substrate;

a source diffusion layer of the first conductivity type positioned on said source base diffusion layer;

a source contact diffusion layer of the first conductivity type positioned on said source diffusion layer;

a back-gate contact diffusion layer of the second conductivity type positioned on said source base diffusion layer adjacent to said source contact diffusion layer;

a source electrode positioned on said source contact diffusion layer and said back-gate contact diffusion layer;

a field oxide film positioned on ends of said source diffusion layer and said source base diffusion layer and doubling as a gate oxide film;

a gate electrode positioned on said field oxide film;

a gate extension electrode positioned on said gate electrode;

a drain base layer of the first conductivity type composed of said first substrate;

a drain offset diffusion layer of the first conductivity type positioned on said drain base layer and extending underneath said field oxide film;

a drain contact diffusion layer of the first conductivity type positioned on said drain offset diffusion layer; and a drain electrode positioned on said drain contact diffusion layer.

7. A semiconductor device according to claim 6, wherein said source base diffusion layer of said transistor of the first conductivity type and said drain offset diffusion layer of said transistor of the second conductivity type extend from a surface of said first substrate to a surface of said embedded oxide film.

* * * * *